US009184269B2

(12) United States Patent
Ching et al.

(10) Patent No.: US 9,184,269 B2
(45) Date of Patent: Nov. 10, 2015

(54) SILICON AND SILICON GERMANIUM NANOWIRE FORMATION

(71) Applicant: Taiwan Semiconductor Manufacturing Company Limited, Hsin-Chu (TW)

(72) Inventors: Kuo-Cheng Ching, Zhubei (TW); Carlos H. Diaz, Mountain View, CA (US); Jean-Pierre Colinge, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 64 days.

(21) Appl. No.: 13/971,239

(22) Filed: Aug. 20, 2013

(65) Prior Publication Data

US 2015/0053928 A1    Feb. 26, 2015

(51) Int. Cl.

| H01L 21/8234 | (2006.01) |
| H01L 29/775 | (2006.01) |
| H01L 21/8238 | (2006.01) |
| B82Y 10/00 | (2011.01) |
| B82Y 40/00 | (2011.01) |
| H01L 29/66 | (2006.01) |
| H01L 29/06 | (2006.01) |

(52) U.S. Cl.
CPC .............. *H01L 29/775* (2013.01); *B82Y 10/00* (2013.01); *B82Y 40/00* (2013.01); *H01L 21/823821* (2013.01); *H01L 29/0673* (2013.01); *H01L 29/66439* (2013.01)

(58) Field of Classification Search
CPC ..................... H01L 21/823821; H01L 29/775

USPC ......... 438/176, 283, 331, 401, 588–589, 752, 438/757, 775–777
See application file for complete search history.

(56) References Cited

U.S. PATENT DOCUMENTS

| 7,727,830 | B2 * | 6/2010 | Jin et al. ......................... 438/197 |
| 7,821,061 | B2 * | 10/2010 | Jin et al. ......................... 257/331 |
| 7,999,251 | B2 * | 8/2011 | Chu et al. ......................... 257/29 |
| 8,110,458 | B2 * | 2/2012 | Jin et al. ......................... 438/197 |
| 8,309,950 | B2 * | 11/2012 | Iwayama et al. ................. 257/24 |
| 8,314,464 | B2 * | 11/2012 | Iwayama et al. .............. 257/365 |
| 8,399,314 | B2 * | 3/2013 | Cohen et al. .................. 438/151 |

(Continued)

OTHER PUBLICATIONS

German Office action dated Oct. 8, 2104.

(Continued)

*Primary Examiner* — Earl Taylor
(74) *Attorney, Agent, or Firm* — Cooper Legal Group, LLC

(57) ABSTRACT

Among other things, one or semiconductor arrangements, and techniques for forming such semiconductor arrangements are provided. For example, one or more silicon and silicon germanium stacks are utilized to form PMOS transistors comprising germanium nanowire channels and NMOS transistors comprising silicon nanowire channels. In an example, a first silicon and silicon germanium stack is oxidized to transform silicon to silicon oxide regions, which are removed to form germanium nanowire channels for PMOS transistors. In another example, silicon and germanium layers within a second silicon and silicon germanium stack are removed to form silicon nanowire channels for NMOS transistors. PMOS transistors having germanium nanowire channels and NMOS transistors having silicon nanowire channels are formed as part of a single fabrication process.

20 Claims, 11 Drawing Sheets

(56) References Cited

U.S. PATENT DOCUMENTS

| | | | |
|---|---|---|---|
| 8,445,892 B2* | 5/2013 | Cohen et al. | 257/24 |
| 8,492,219 B2* | 7/2013 | Saitoh et al. | 438/200 |
| 8,709,888 B2* | 4/2014 | Chang et al. | 438/209 |
| 8,722,472 B2* | 5/2014 | Chang et al. | 438/154 |
| 8,753,942 B2* | 6/2014 | Kuhn et al. | 438/285 |
| 8,936,972 B2* | 1/2015 | Bangsaruntip et al. | 438/149 |
| 8,940,645 B2* | 1/2015 | Ramkumar et al. | 438/758 |
| 2005/0224889 A1* | 10/2005 | Oh et al. | 257/369 |
| 2008/0042120 A1* | 2/2008 | Shibata et al. | 257/13 |
| 2008/0061284 A1* | 3/2008 | Chu et al. | 257/9 |
| 2008/0237575 A1* | 10/2008 | Jin et al. | 257/19 |
| 2009/0170251 A1* | 7/2009 | Jin et al. | 438/197 |
| 2010/0200835 A1* | 8/2010 | Jin et al. | 257/9 |
| 2011/0253982 A1* | 10/2011 | Wang et al. | 257/24 |
| 2012/0138886 A1* | 6/2012 | Kuhn et al. | 257/9 |
| 2012/0199812 A1* | 8/2012 | Baykan et al. | 257/13 |
| 2014/0001520 A1* | 1/2014 | Glass et al. | 257/288 |
| 2014/0042386 A1* | 2/2014 | Cea et al. | 257/9 |
| 2014/0131660 A1* | 5/2014 | Cea et al. | 257/24 |
| 2014/0197377 A1* | 7/2014 | Kim et al. | 257/29 |
| 2014/0209855 A1* | 7/2014 | Cea et al. | 257/9 |
| 2014/0264253 A1* | 9/2014 | Kim et al. | 257/9 |
| 2014/0264280 A1* | 9/2014 | Kim et al. | 257/29 |
| 2014/0326952 A1* | 11/2014 | Kuhn et al. | 257/24 |
| 2014/0353591 A1* | 12/2014 | Kim et al. | 257/29 |
| 2015/0053928 A1* | 2/2015 | Ching et al. | 257/29 |

OTHER PUBLICATIONS

Domel, et al., "Hydrogen annealing of arrays of planar and vertically stacked Si nanowires", Citation: Appl. Phys. Lett. 91, 233502 (2007); doi: 10.1063/1.2818678, Published by the American Institute of Physics, pp. 4, http://dx.doi.org/1031063/1.2818678.

Ernst, et al., "Ultra-dense silicon nanowires: A technology, transport and interfaces challenges insight (invited)", Microelectronic Engineering, journal homepage: www.elsevier.com/locate/mee, Microelectronic Engineering 88 (2011) pp. 1198-1202.

* cited by examiner

SILICON AND SILICON GERMANIUM NANOWIRE FORMATION

BACKGROUND

A transistor, such as a FinFET transistor, comprises a source region, a drain region, and a channel region between the source region and the drain region. The transistor comprises a gate region that controls the channel region to operate the transistor. The gate region can be formed around one or more surfaces of the channel region, which provides the gate region with increased control over the channel region because the transistor can be controlled by a 3D gate area, as opposed to being controlled merely by a 2D gate area associated with a 2D planar transistor.

DETAILED DESCRIPTION

Figure 1:
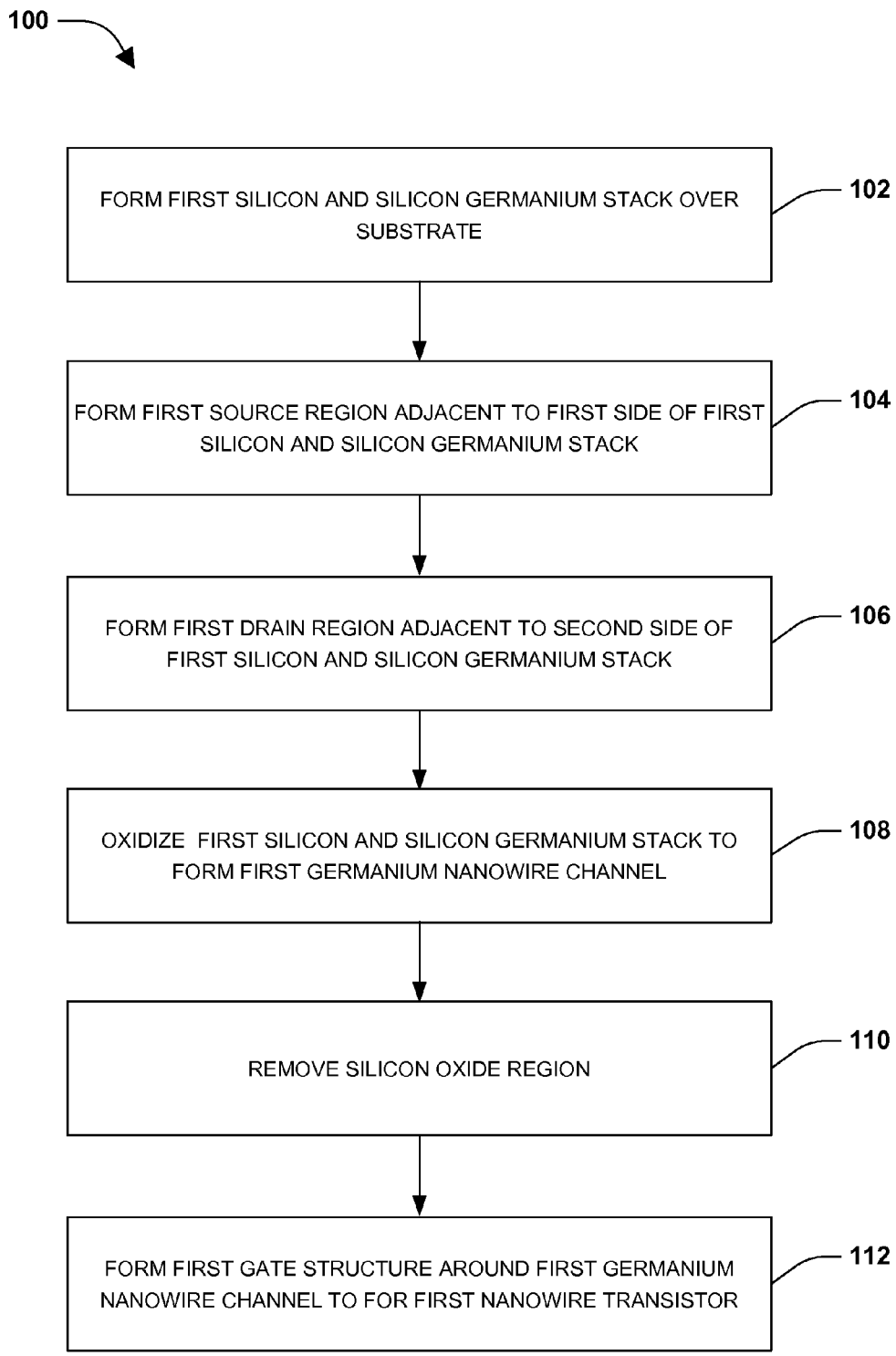
FIG. 1 is a flow diagram illustrating a method of forming a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor arrangements, and one or more techniques for forming such semiconductor arrangements are provided herein. For example, a semiconductor arrangement comprises silicon and silicon germanium stacks that are used to create germanium nanowire channels for PMOS transistors and silicon nanowire channels for NMOS transistors. In an example, the PMOS transistors and the NMOS transistors can be formed during a single fabrication process, such that a PMOS transistor is protected with a hard mask while an NMOS transistor is being processed, and the NMOS transistor is protected with a hard mask while the PMOS transistor is being processed.

To form a germanium nanowire channel from the silicon and silicon germanium stack for a PMOS transistor, the silicon and silicon germanium stack is oxidized so that the silicon is transformed into a silicon oxide region such as silicon dioxide, resulting in a germanium nanowire channel. In an embodiment, a nanowire comprising a germanium nanowire channel has a diameter between about 5 nm to about 15 nm. In an embodiment such a diameter is between about 15 nm to about 55 nm. In an embodiment such a diameter is between about 20 nm to about 30 nm. In an embodiment such a diameter is about 6 nm. In an embodiment, a nanowire comprising a germanium nanowire channel has a length or defines a channel length of between about 15 nm to about 55 nm, where such a channel length is measured from a source region to a drain region of the PMOS transistor. The silicon oxide region can be removed, and a gate structure can be formed around one or more surfaces, such as one, two, three, or all surfaces, of the germanium nanowire channel.

To form a silicon nanowire channel from a second silicon and silicon germanium stack for a NMOS transistor, a silicon germanium layer is removed from the second silicon and silicon germanium stack to form a silicon nanowire channel. In an embodiment, a nanowire comprising a silicon nanowire channel has a diameter between about 5 nm to about 15 nm. In an embodiment such a diameter is between about 15 nm to about 55 nm. In an embodiment such a diameter is between about 20 nm to about 30 nm. In an embodiment such a diameter is about 6 nm. In an embodiment, the silicon nanowire channel has a diameter that is equal to or substantially equal to a diameter of the germanium nanowire channel. In an embodiment, the silicon nanowire channel has a diameter that is larger than a diameter of the germanium nanowire channel. In an embodiment, the silicon nanowire channel has a diameter that is between about 2 nm to about 3 nm larger than a diameter of the germanium nanowire channel. In an embodiment, the silicon nanowire channel has a diameter that is between about 20% to about 40% larger than a diameter of the germanium nanowire channel. In an embodiment, a nanowire comprising a silicon nanowire channel has a length or defines a channel length of between about 15 nm to about 55 nm, where such a channel length is measured from a source region to a drain region of the NMOS transistor.

In this way, PMOS transistors, comprising germanium nanowire channels, and NMOS transistors, comprising silicon nanowire channels, can be formed within the semiconductor arrangement from silicon and silicon germanium stacks. In an example, the semiconductor arrangement has improved current, such as between about 14% to about 16% improved current for NMOS transistors and between about 13% to about 15% improved current for PMOS transistors. In an example, the semiconductor arrangement has reduced short channel effect, such as between about 6% to about 8% reduction for NMOS transistors and between about 4% to about 6% reduction for PMOS transistors.

In an embodiment, a gate dielectric layer is formed around at least one of the silicon nanowire channel or the germanium nanowire channel. In an embodiment, the gate dielectric layer comprises at least one of an interfacial layer (IL) or a high-k dielectric layer (HK layer). In an embodiment, the IL has a thickness between about 5A to about 15A. In an embodiment, the HK layer has a thickness between about 5A to about 20A. In an embodiment, at least one of the thickness of the IL around the silicon nanowire channel or the thickness of the HK layer around the silicon nanowire channel is less than at least one of the thickness of the IL around the germanium nanowire channel or the thickness of the HK layer around the germanium nanowire channel. In an embodiment, at least one of the thickness of the IL around the silicon nanowire channel or the thickness of the HK layer around the silicon nanowire channel is between about 5% to about 15% less than at least one of the thickness of the IL around the germanium nanowire channel or the thickness of the HK layer around the germanium nanowire channel.

A method 100 of forming a semiconductor arrangement is illustrated in FIG. 1, and one or more semiconductor arrangements formed by such a methodology are illustrated in FIGS. 2-10. A semiconductor arrangement 250 comprises a substrate 202, as illustrated in embodiment 200 of FIG. 2. In an example, the substrate 202 comprises silicon, and the substrate 202 is formed according to a FinFET arrangement comprising one more silicon fins separated by isolation structures 204, such as shallow trench isolation (STI). For example, a first fin 202a, a second fin 202b, a third fin 202c, and a fourth fin 202d are formed from the substrate 202. In an example, an isolation structure has a depth between about 60 nm to about 120 nm. In an example, a recessed space, between about 50 nm to about 110 nm, is formed into the substrate 202 for formation of silicon and silicon germanium, such as through an epi growth technique for a silicon and silicon germanium stack where an epi thickness of silicon germanium is between about 5 nm to about 15 nm and an epi thickness for silicon is between about 5 nm to about 15 nm.

Figure 2:
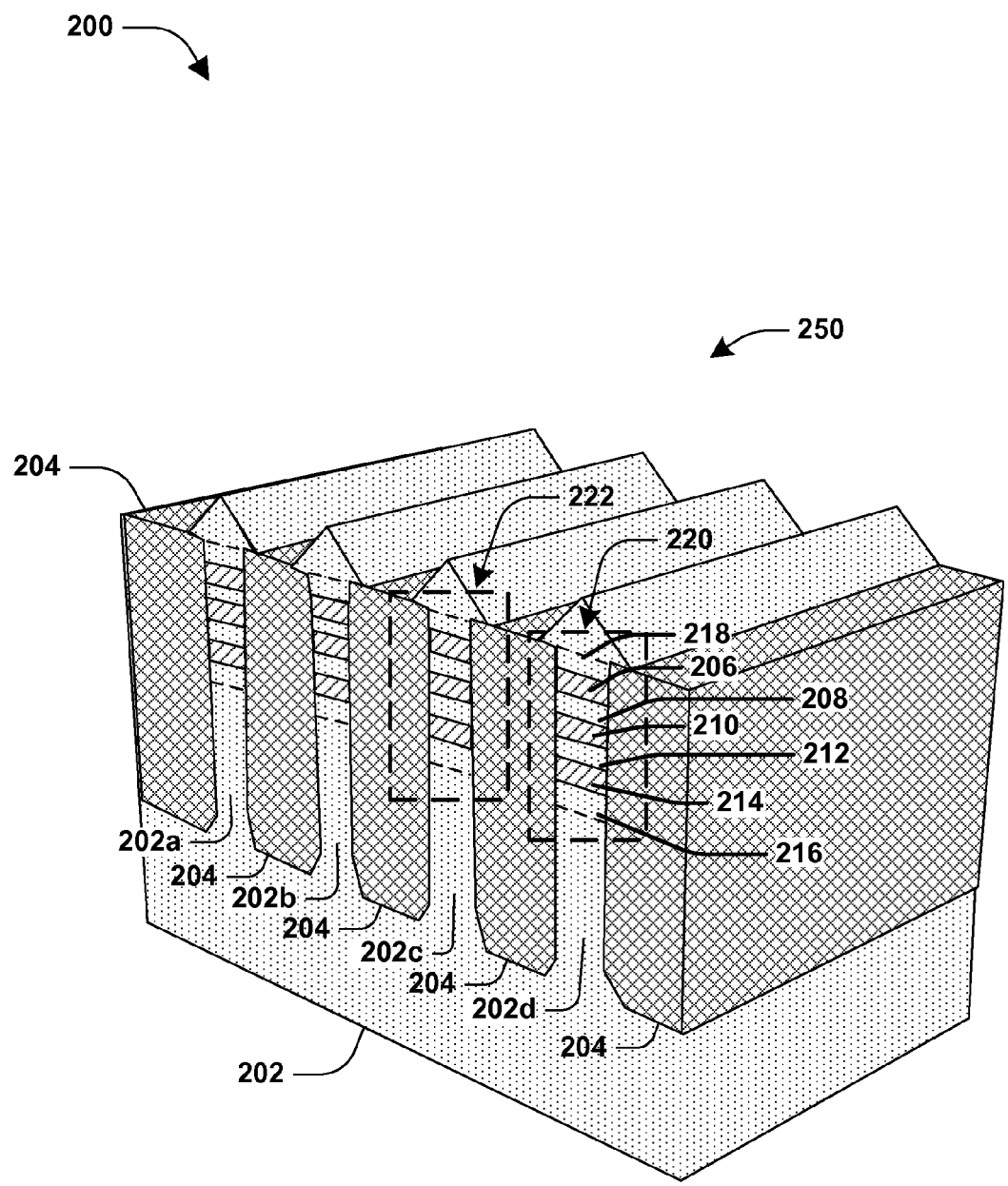
FIG. 2 is an illustration of a silicon and silicon germanium stack, according to some embodiments.

At 102, a silicon and silicon germanium stack is formed over the substrate 202, as illustrated in embodiment 200 of FIG. 2. For example, a first silicon and silicon germanium stack 220, a second silicon and silicon germanium stack 222, or other silicon and silicon germanium stacks not illustrated or identified are formed over the substrate 202. The first silicon and silicon germanium stack 220 comprises one or more silicon layers and one or more silicon germanium layers. For example, the first silicon and silicon germanium stack 220 comprises a first silicon layer 218, a first silicon germanium layer 206, a second silicon layer 208, a second silicon germanium layer 210, a third silicon layer 212, a third silicon germanium layer 214, and a fourth silicon layer 216. It is appreciated that any number of silicon layers or silicon germanium layers can be formed. In an example, a silicon germanium layer comprises between about 20% to about 50% germanium.

Figure 3:
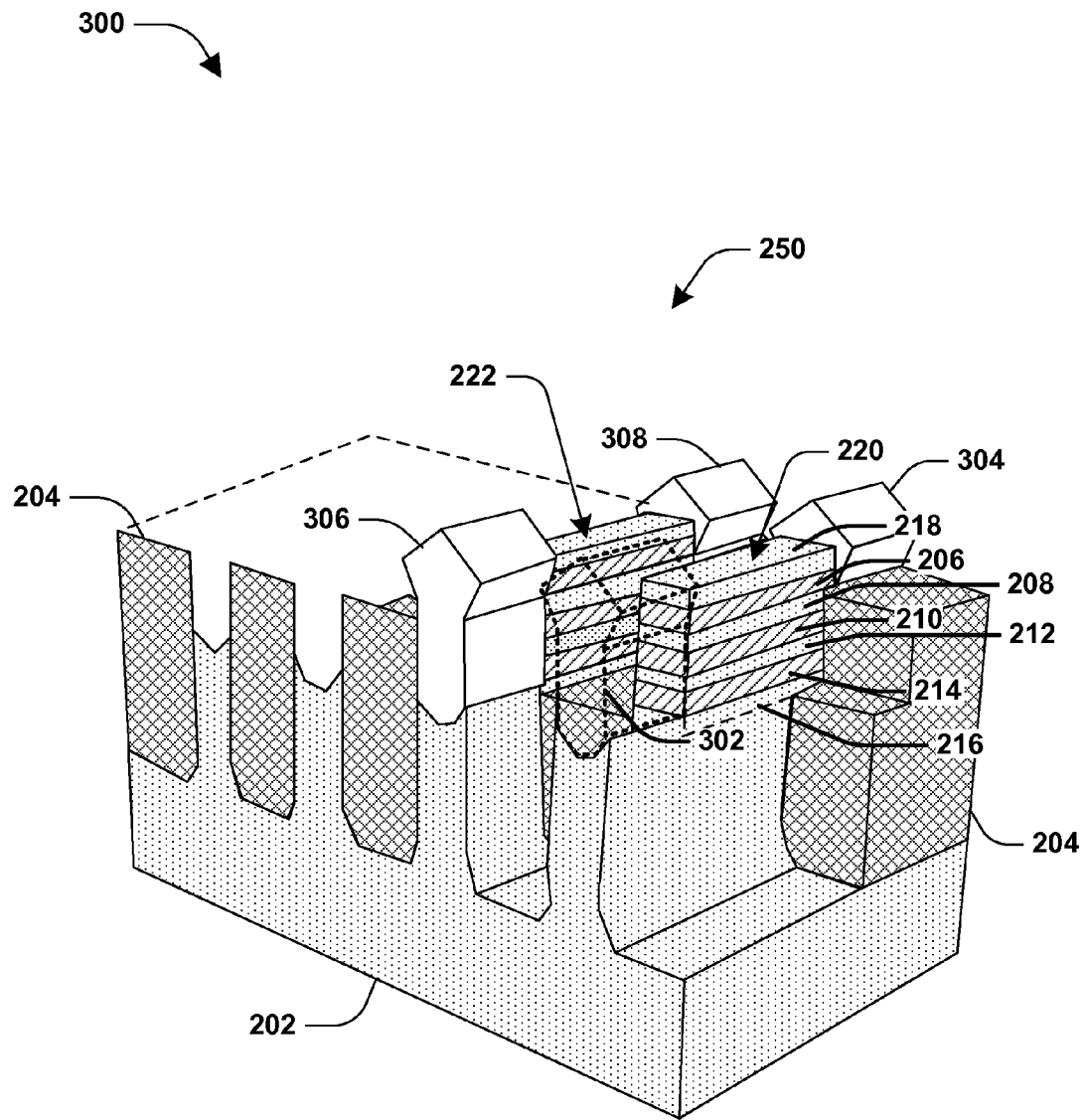
FIG. 3 is an illustration of a first source region and a first drain region, according to some embodiments.

At 104, a first source region 302 is formed adjacent to a first side of the first silicon and silicon germanium stack 220, as illustrated in embodiment 300 of FIG. 3. It is appreciated that the first source region 302 is illustrated by dashed lines for illustrative purposes so that other portions of the semiconductor arrangement 250 are visible or apparent. At 106, a first drain region 304 is formed adjacent to a second side of the first silicon and silicon germanium stack 220, as illustrated in embodiment 300 of FIG. 3. In an example of forming the first source region 302 and the first drain region 304, a sacrificial gate is formed, such as a polygate formed by a patterning technique, over the substrate 202 and over the first silicon and silicon germanium stack 220. Spacers are formed, such as by a deposition technique, on sidewalls of the of the semiconductor arrangement 250. Portions of the first silicon and silicon germanium stack 220, corresponding to the first source region 302 and the first drain region 304, are removed, such as through an etching technique. Source and drain material is formed within the first source region 302 and the first drain region 304, such as through an epitaxial growth technique, to create a first source and a first drain for a first nanowire transistor. Other source regions, such as a second source region 306, and drain regions, such as a second drain region 308, are formed for other nanowire transistors that are to be formed for the semiconductor arrangement 250.

Figure 4:
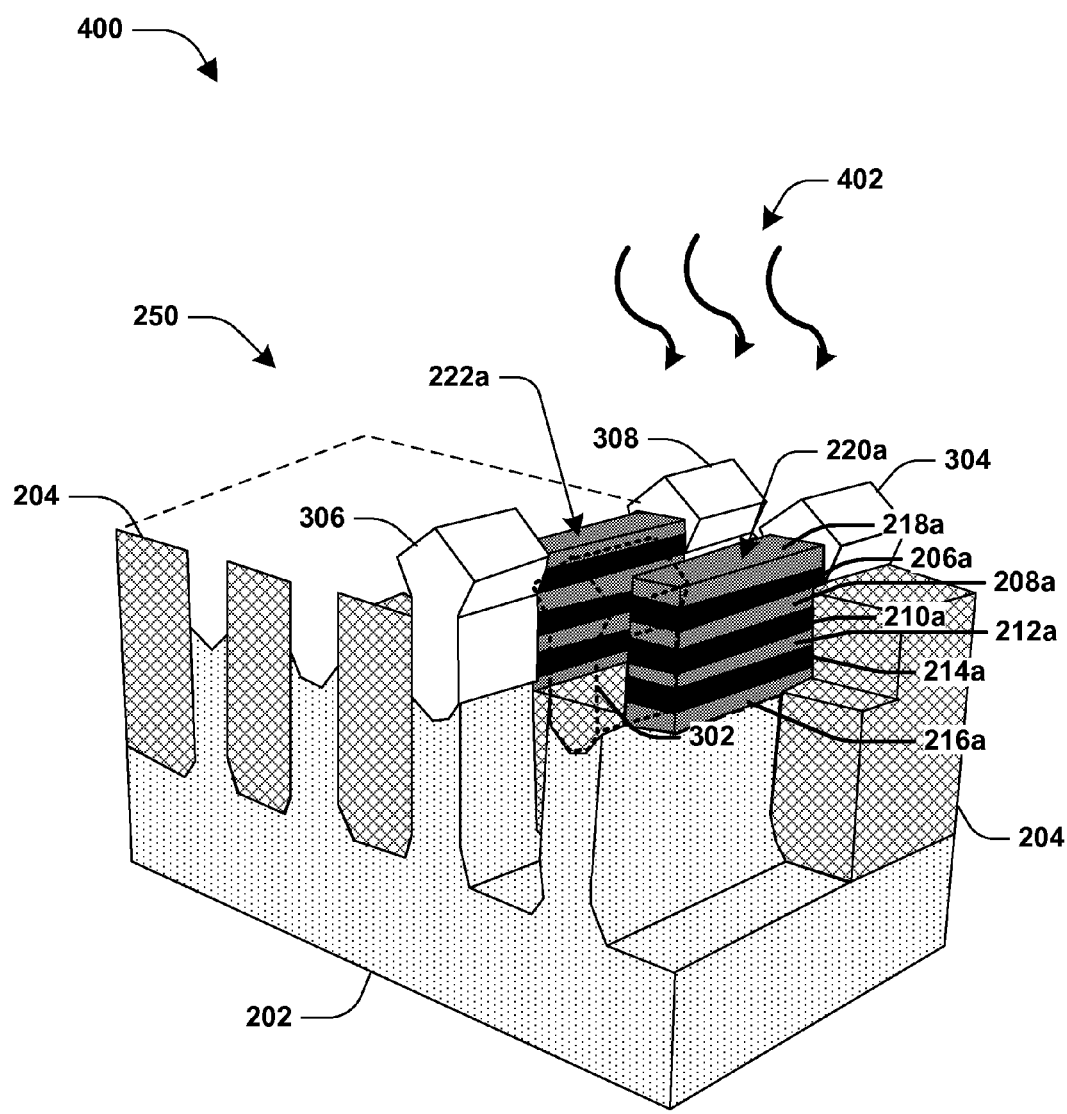
FIG. 4 is an illustration of oxidizing a silicon and silicon germanium stack, according to some embodiments.

At 108, the first silicon and silicon germanium stack 220, illustrated in embodiment 300 of FIG. 3, is oxidized 402 to form a first oxidized stack 220a, as illustrated in embodiment 400 of FIG. 4. In an example, the second silicon and silicon germanium stack 222, illustrated in embodiment 300 of FIG. 3, is oxidized 402 to form a second oxidized stack 222a, as illustrated in embodiment 400 of FIG. 4. In an example, the oxidizing 402 comprises removing a sacrificial gate, not illustrated, over the first silicon and silicon germanium stack 220 to expose the first silicon and silicon germanium stack 220 to ambient oxygen. Oxidizing 402 the first silicon and silicon germanium stack 220 transforms silicon, such as silicon of a silicon layer or silicon of a silicon germanium layer, to silicon oxide such as silicon dioxide. For example, the first silicon layer 218 is transformed to a first silicon oxide region 218a. Silicon of the first silicon germanium layer 206 is transformed to silicon oxide, resulting in a first germanium nanowire channel 206a between the first source region 302 and the first drain region 304. The second silicon layer 208 is transformed to a second silicon oxide region 208a. Silicon of the second silicon germanium layer 210 is transformed into silicon oxide, resulting in a second germanium nanowire channel 210a between the first source region 302 and the first drain region 304. The third silicon layer 212 is transformed to a third silicon oxide region 212a. Silicon of the third silicon germanium layer 214 is transformed into silicon oxide, resulting in a third germanium nanowire channel 214a between the first source region 302 and the first drain region 304. The fourth silicon layer 216 is transformed to a fourth silicon oxide region 216a. In an example, remaining germanium of a silicon and germanium layer is condensed into a germanium nanowire channel. In an example, the first germanium nanowire channel 206a and the second germanium nanowire channel 210a are formed such that a space of about 5 nm or greater is between the first germanium nanowire channel 206a and the second germanium nanowire channel 210a so that interfacial layer material, high-k dielectric layer material, or titanium nitride capping layer material can be formed around the first germanium nanowire channel 206a and the second germanium nanowire channel 210a. In this way, the first silicon and silicon germanium stack 220 or other silicon and silicon germanium stacks are oxidized 402 to form germanium nanowire channels.

Figure 5:
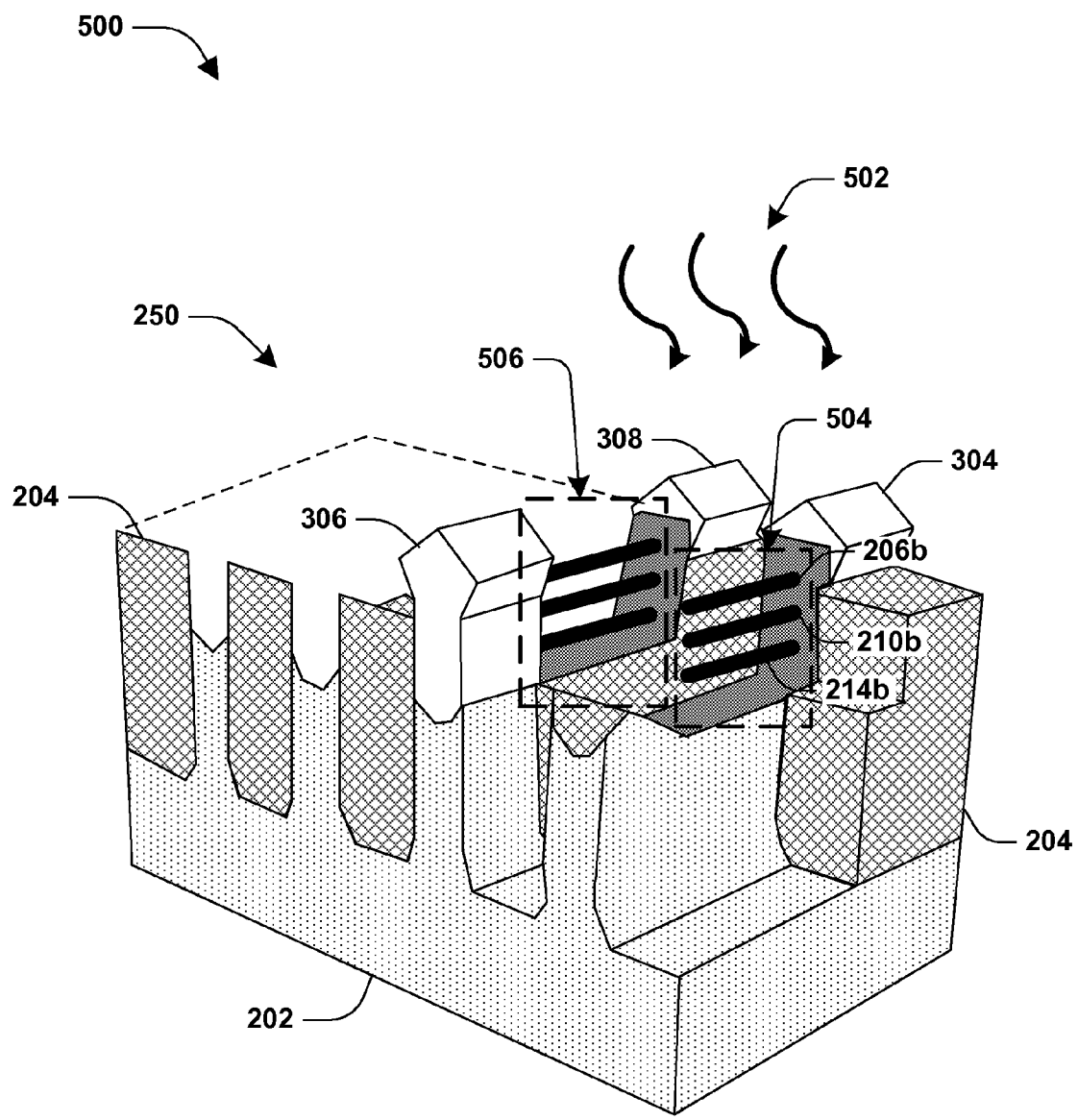
FIG. 5 is an illustration of a removing silicon oxide region, according to some embodiments.

At 110, silicon oxide, such as a silicon oxide region, is removed, as illustrated in embodiment 500 of FIG. 5. That is, silicon oxide is removed to expose the germanium nanowire channels, and to form a region within which a gate structure can be formed. In an example, the first silicon oxide region 218a, the second silicon oxide region 208a, the third silicon oxide region 212a, the fourth silicon oxide region 216a, or other silicon oxide, such as silicon oxide formed from oxidizing 402 silicon germanium layers, are removed by an etching process 502. Germanium nanowire channels, such as the first germanium nanowire channel 206a, the second germanium nanowire channel 210a, the third germanium nanowire channel 214a, or other germanium nanowire channels, can be formed according to various configurations, shapes, or sizes, such as a first germanium nanowire channel 206b having a cylindrical configuration, a second germanium nanowire channel 210b having the cylindrical configuration, and a third germanium nanowire channel 214b having the cylindrical configuration. In this way, source regions, drain regions, and germanium nanowire channels are formed for a first nanowire transistor 504, a second nanowire transistor 506, or other PMOS nanowire transistors.

Figure 6:
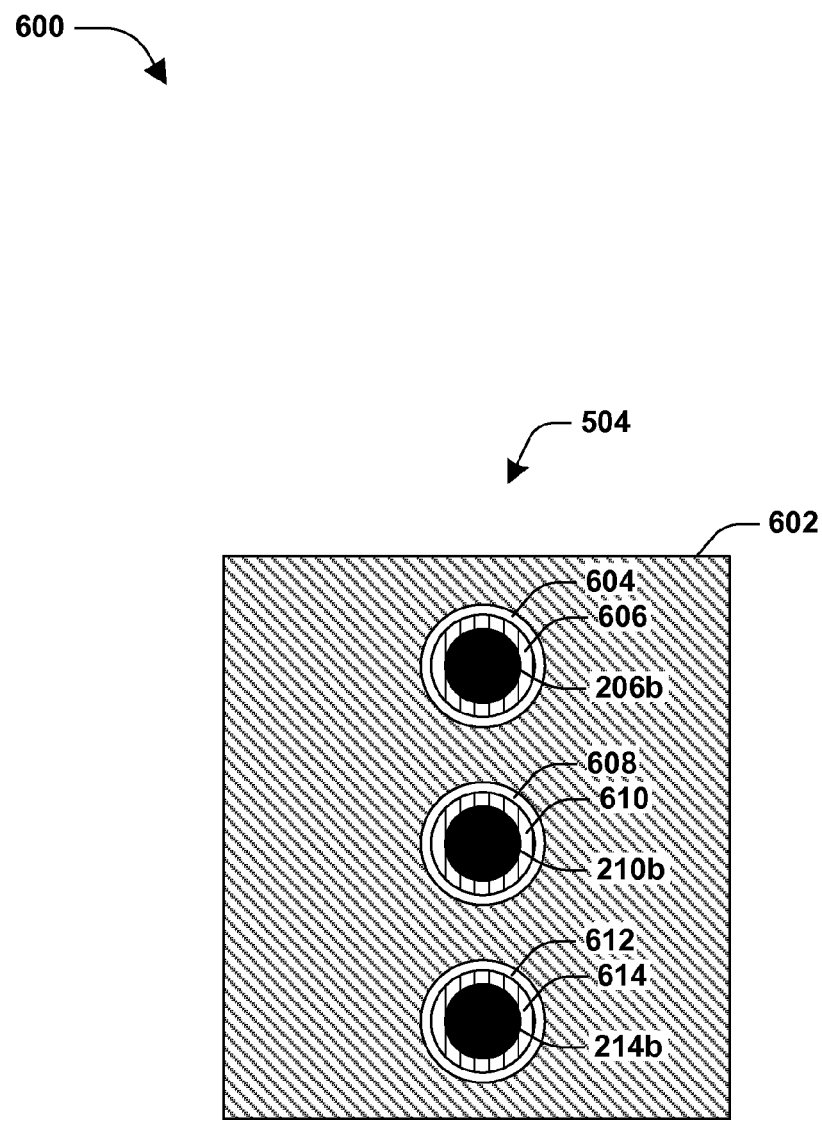
FIG. 6 is an illustration of a first set of nanowire transistors comprising a gate structure formed according to a gate-all-around structure, according to some embodiments.
Figure 7:
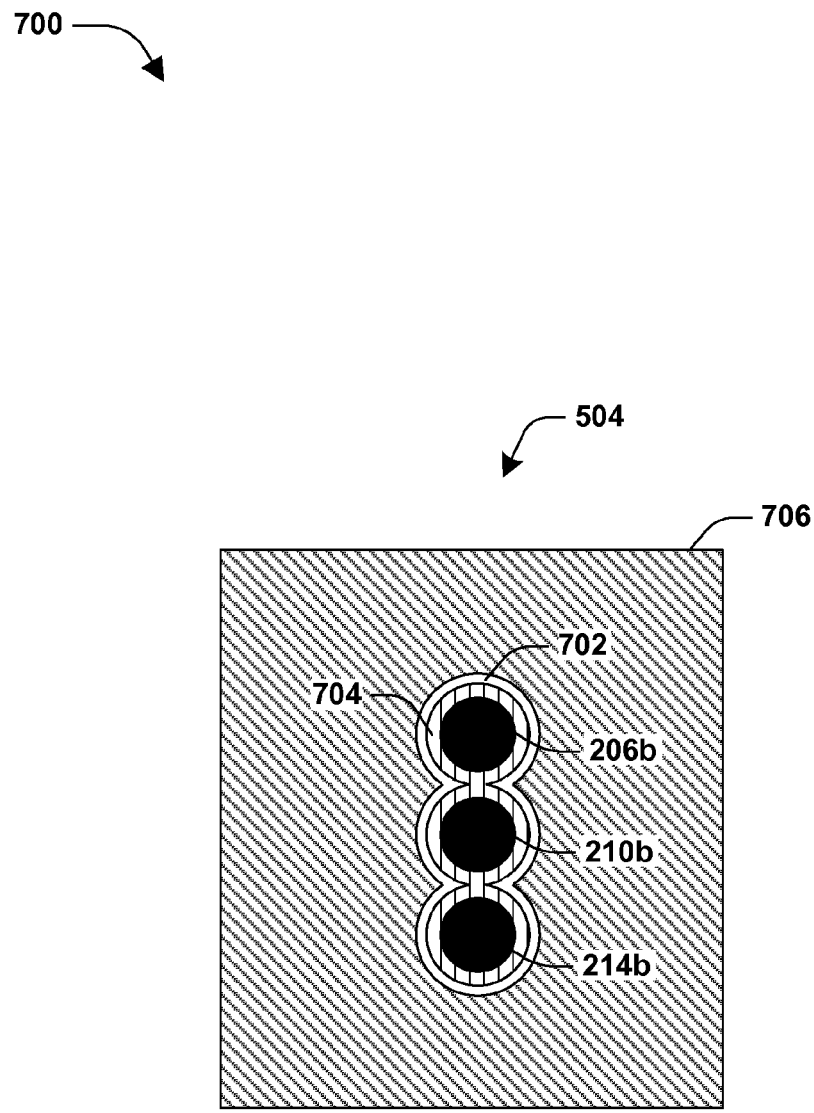
FIG. 7 is an illustration of a first set of nanowire transistors, according to some embodiments.

In an example, a first interfacial layer 606 is formed around the first germanium nanowire channel 206b, a second interfacial layer 610 is formed around the second germanium nanowire channel 210b, and a third interfacial layer 614 is formed around the third germanium nanowire channel 214b, as illustrated in embodiment 600 of FIG. 6. An interfacial layer is formed to improve adhesion between materials or layers. In an example, an interfacial layer comprises nitride, oxide, or other suitable material. In an example, a first high-k dielectric layer 604 is formed around the first interfacial layer 606, a second high-k dielectric layer 608 is formed around the second interfacial layer 610, and a third high-k dielectric layer 612 is formed around the third interfacial layer 614, as illustrated in embodiment 600 of FIG. 6. In an example, a titanium nitride capping layer is formed around one or more high-k dielectric layers. In an example, a barrier, such as TaN or TiN is formed around the titanium nitride capping layer.

At 112, a first gate structure 602 is formed around the first germanium nanowire channel 206b, to form the first nanowire transistors 504, as illustrated in embodiment 600 of FIG. 6. In an example, the first gate structure 602 comprises TiN or W, alone or in combination. In the illustrated example, given that there are three germanium nanowire channels, the first gate structure is also formed around the second germanium nanowire channel 210b, and the third germanium nanowire channel 214b. In an example, the first gate structure 602 is formed as a gate-all-around structure surrounding the germanium nanowire channels to increase gate control, as illustrated in embodiment 600 of FIG. 6. In another example, a first gate structure 706 is formed around one or more surfaces of the germanium nanowire channels, as illustrated in embodiment 700 of FIG. 7. For example, a first interfacial layer 704 is formed around the first germanium nanowire channel 206b, the second germanium nanowire channel 210b, and the third germanium nanowire channel 214b. A high-k dielectric layer 702 is formed around the first interfacial layer 704. The first gate structure 706 is formed around the high-k dielectric layer 702. In this way, the first gate structure 706 is formed around some, but not all, surfaces of the germanium nanowire channels, which can increase channel density within the first nanowire transistor 504. The first nanowire transistor 504, the second nanowire transistor 506, or other nanowire transistor within the semiconductor arrangement 250 are formed as PMOS transistors, where germanium nanowire channels are formed as P channels for the PMOS transistors. In an example, a first interlayer dielectric is formed over one or more source regions and a second interlayer dielectric is formed over one or more drain regions. In this way, gate structures are formed between the first interlayer dielectric and the second interlayer dielectric. In an example, a blocking layer is formed below the germanium nanowire channels to mitigate punch through or leakage.

In an example, one or more NMOS transistors are formed within the semiconductor arrangement 250 before, during, and/or after formation of the one or more PMOS transistors as a single fabrication process because formation of NMOS transistors and formation of PMOS transistors both utilize silicon and silicon germanium stacks. For example, during at least some of the processes of forming the PMOS transistors, NMOS portion of the semiconductor arrangement 250 are protected by a hard mask. During at least some of the processes of forming the NMOS transistors, PMOS portions of the semiconductor are protected by a hard mask.

Figure 8:
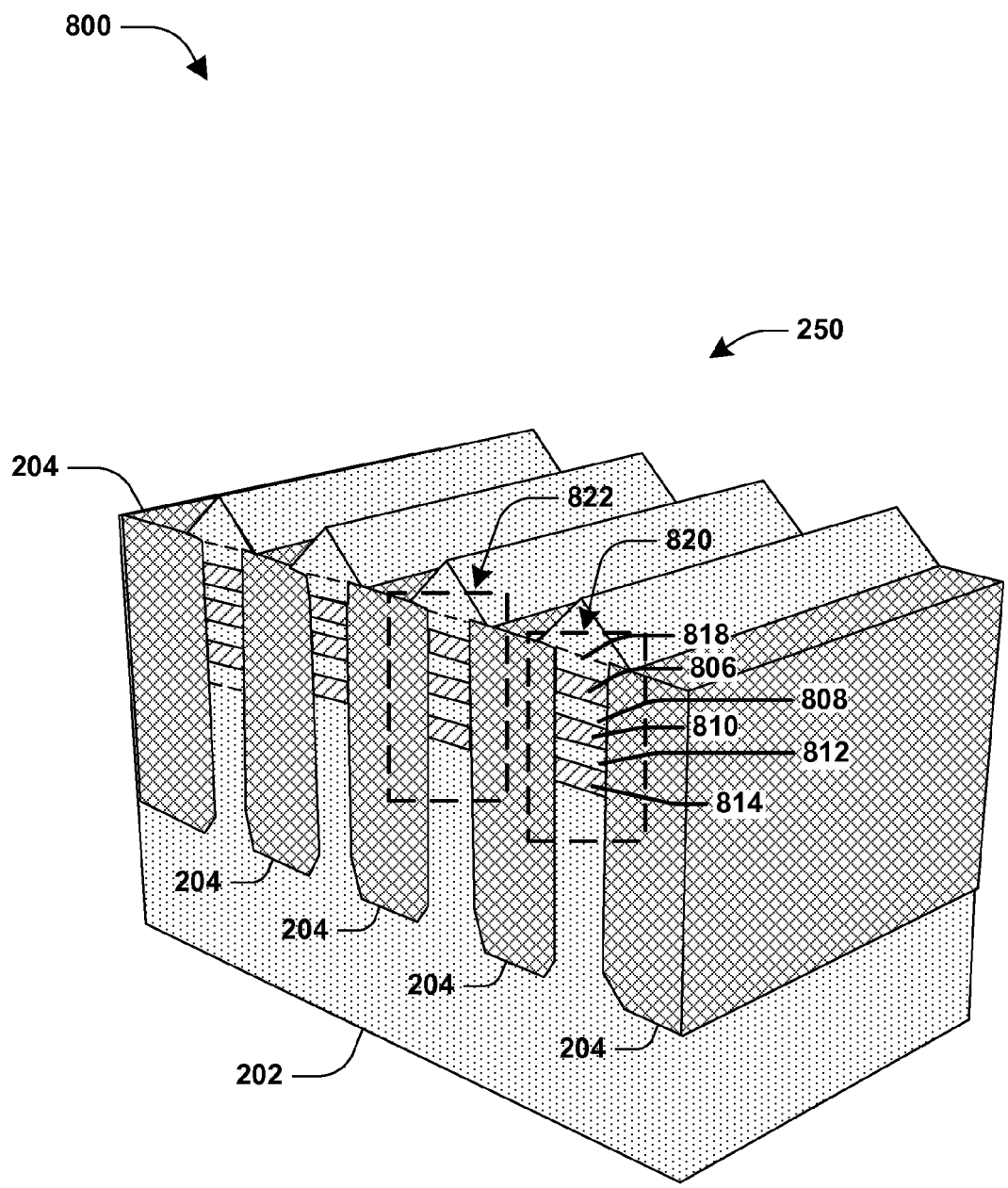
FIG. 8 is an illustration of a silicon and silicon germanium stack, according to some embodiments.
Figure 9:
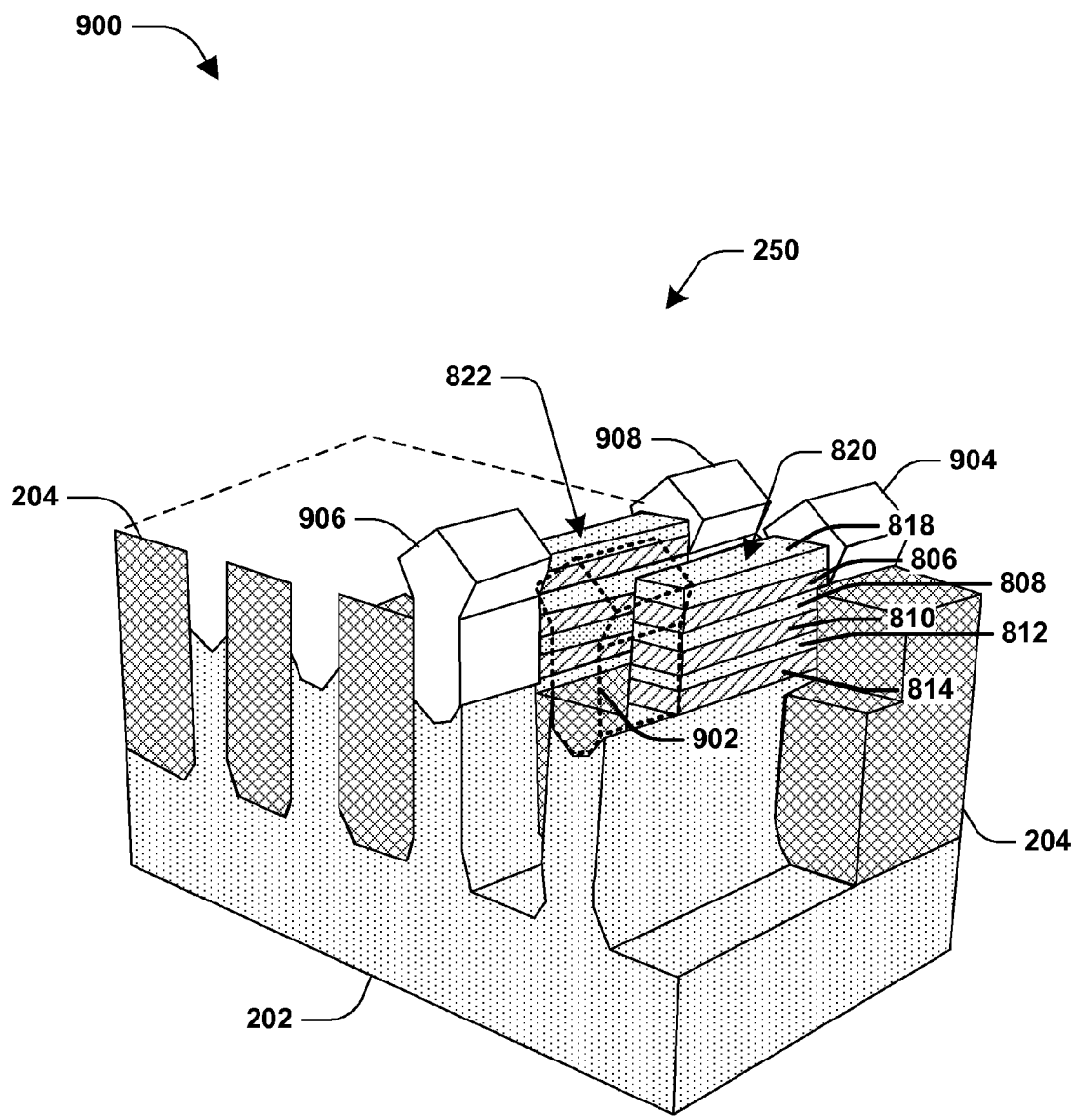
FIG. 9 is an illustration of a third source region and a third drain region, according to some embodiments.
Figure 10:
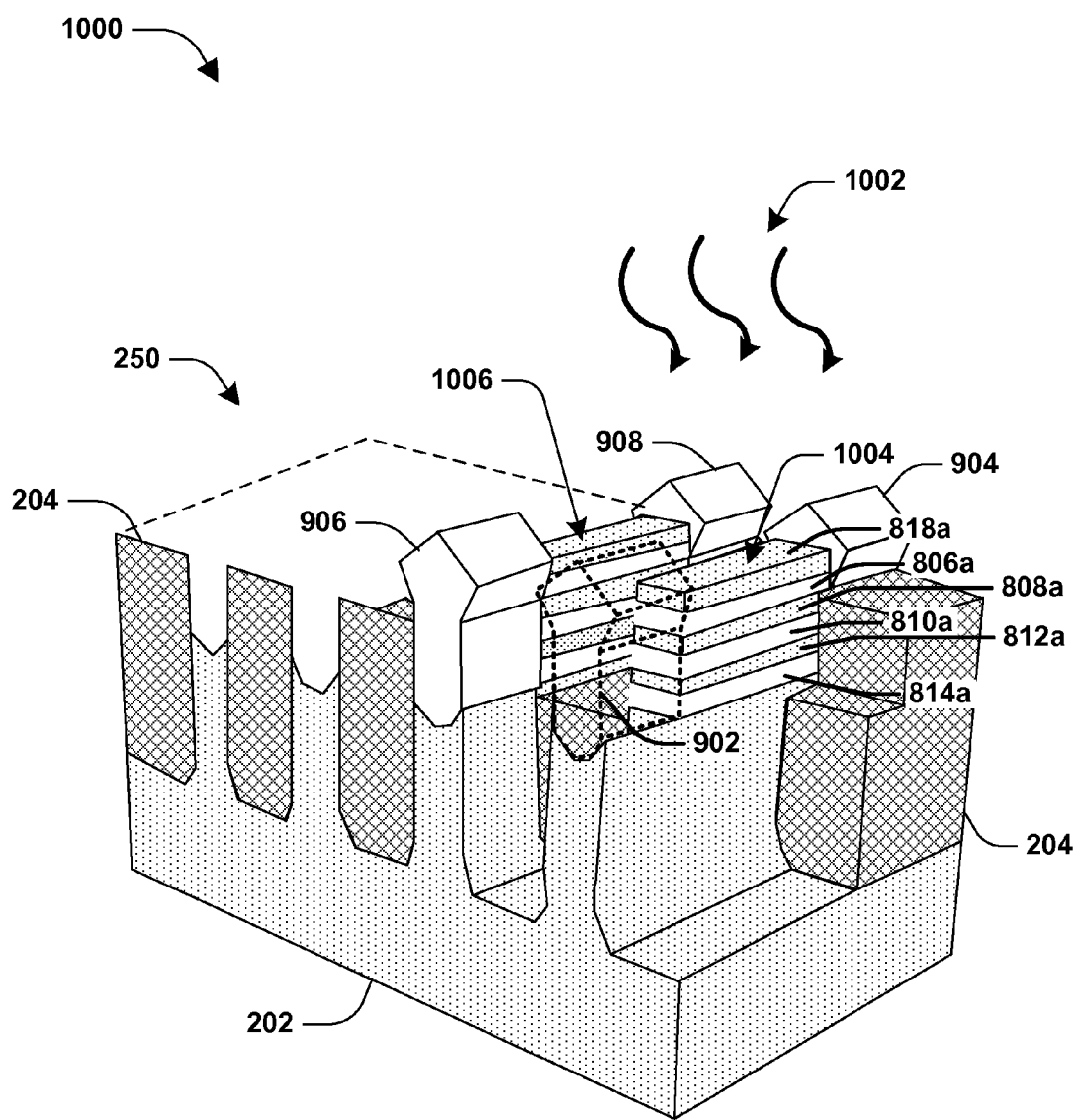
FIG. 10 is an illustration of a third set of nanowire transistors, according to some embodiments.

FIGS. 8-10 illustrate embodiments of forming one or more NMOS transistors within the semiconductor arrangement 250 utilizing silicon and silicon germanium stacks. In an example, the first nanowire transistor 504, the second nanowire transistor 506, or other nanowire transistors formed as PMOS transistors within the semiconductor arrangement 250 are protected by a hard mask during formation of the one or more NMOS transistors.

In an example, a third silicon and silicon germanium stack 820, a fourth silicon and silicon germanium stack 822, or other silicon and silicon germanium stacks are formed over the substrate 202, as illustrated in embodiment 800 of FIG. 8. The third silicon and silicon germanium stack 820 comprises one or more silicon layers and one or more silicon germanium layers. For example, the third silicon and silicon germanium stack 820 comprises a first silicon layer 818, a first silicon germanium layer 806, a second silicon layer 808, a second silicon germanium layer 810, a third silicon layer 812, and a third silicon germanium layer 814. It is appreciated that any number of silicon layers or silicon germanium layers can be formed.

A third source region 902 is formed on a first side of the third silicon and silicon germanium stack 820 and a third drain region 904 is formed on a second side of the third silicon and silicon germanium stack 820, as illustrated in embodiment 900 of FIG. 9. In an example, a fourth source region 906, a fourth drain region 908, or other source and drain regions are formed adjacent to silicon and silicon germanium stacks. Silicon germanium layers within the silicon and silicon germanium stacks are removed to form silicon nanowire channels between source regions and drain regions, as illustrated in embodiment 1000 of FIG. 10. In an example, the first silicon germanium layer 806 is removed to form a first space 806a between a first silicon nanowire channel 818a and a second silicon nanowire channel 808a, the second silicon germanium layer 810 is removed to form a second space 810a between the second silicon nanowire channel 808a and a third silicon nanowire channel 812a, and the third silicon germanium layer 814 is removed to form a third space 814a between the third silicon nanowire channel 812a and the substrate 202. In an example, a chemical etch 1002 is performed to remove the silicon germanium layers from the silicon and silicon germanium stacks. In an example, the silicon nanowire channels can be formed according to various configurations, shapes, or sizes, such as cylindrical shapes. For example, an oxidation technique or a hydrogen annealing technique is performed to smooth the silicon nanowire channels. In an example, gate structures are formed around the silicon nanowire channels to form a third nanowire transistor 1004, a fourth nanowire transistor 1006, or other NMOS nanowire transistors, not illustrated.

In an example, an interfacial layer is formed around one or more of the silicon nanowire channels. In an example, a high-k dielectric layer is formed around one or more of the silicon nanowire channels or around an interfacial layer if present. A gate structure may be formed as a gate-all-around structure, or around fewer than all sides of a silicon nanowire channel. In an example, the gate structure comprises TiN or W, alone or in combination. Formation of one or more of such gate structures, interfacial layers or high-k dielectric layers is in accordance with that described above with regard to formation of a PMOS transistor, according to some embodiments. In an example, a titanium nitride capping layer is formed around one or more high-k dielectric layers. In an example, a barrier, such as TaN, TiAlC, TaAlC, or TiAl is formed around the titanium nitride capping layer. In an example, gate height for a PMOS nanowire transistor is less than a gate height for an NMOS nanowire transistor. In this way, NMOS transistors and PMOS transistors are formed within the semiconductor arrangement 250 utilizing silicon and silicon germanium stacks.

Figure 11:
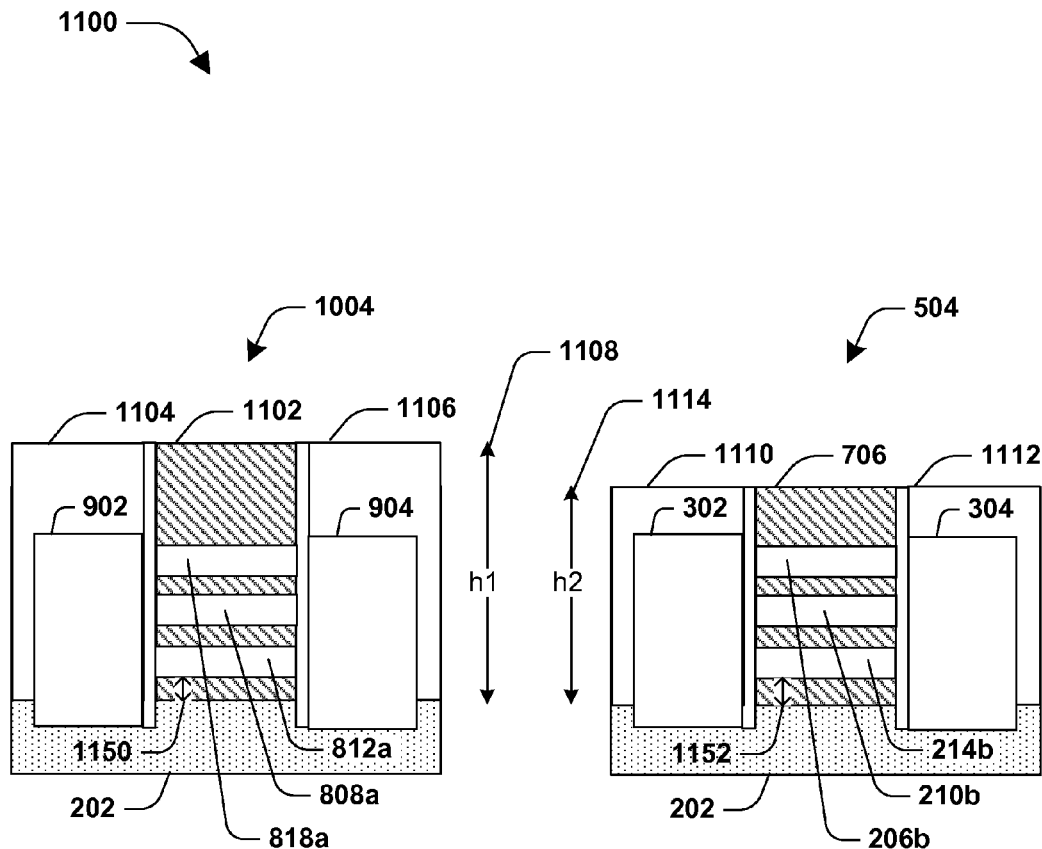
FIG. 11 is an illustration of an NMOS gate height and a PMOS gate height, according to some embodiments.

FIG. 11 illustrates an embodiment 1100 of an NMOS gate height 1108 and a PMOS gate height 1114. A third nanowire transistor 1004 comprises an NMOS transistor. The third nanowire transistor 1004 comprises a third source region 902 and a third drain region 904 formed over a substrate 202. The third nanowire transistor 1004 comprises a first silicon nanowire channel 818a, a second silicon nanowire channel 808a, and a third silicon nanowire channel 812a formed between the third source region 902 and the third drain region 904. A first interlayer dielectric 1104 is formed over the third source region 902, and a second interlayer dielectric 1106 is formed over the third drain region 904. A gate structure 1102 is formed around the first silicon nanowire channel 818a, the second silicon nanowire channel 808a, and the third silicon nanowire channel 812a. The gate structure 1102 has an NMOS gate height 1108.

A first nanowire transistor 504 comprises a PMOS transistor. The first nanowire transistor 504 comprises a first source region 302 and a first drain region 304 formed over the substrate 202. The first nanowire transistor 504 comprises a first germanium nanowire channel 206b, a second germanium nanowire channel 210b, and a third germanium nanowire channel 214b formed between the first source region 302 and the first drain region 304. A third interlayer dielectric 1110 is formed over the first source region 302, and a fourth interlayer dielectric 1112 is formed over the first drain region 304. A first gate structure 706 is formed around the first germanium nanowire channel 206b, the second germanium nanowire channel 210b, and the third germanium nanowire channel 214b. The first gate structure 706 has a PMOS gate height 1114. In an example, the PMOS gate height 1114 is less than the NMOS gate height 1108. For example, the PMOS gate height 1114 is less than the NMOS gate height 1108 due to double metal gate CMP used for PMOS.

In an embodiment, a silicon nanowire to substrate distance 1150 is the same as a germanium nanowire to substrate distance 1152, where the silicon nanowire to substrate distance 1150 is not limited to being relative to the third silicon nanowire channel 812a and the germanium nanowire to substrate distance 1152 is not limited to being relative to the third germanium nanowire channel 214b. In an embodiment, the silicon nanowire to substrate distance 1150 is larger than the germanium nanowire to substrate distance 1152. In an embodiment the silicon nanowire to substrate distance 1150 is between about 1 nm to about 10 nm larger than the germanium nanowire to substrate distance 1152. In an embodiment, at least one of thermal annealing, gate dielectric formation, or threshold voltage adjustment associated with forming a PMOS transistor comprising a germanium nanowire channel can be performed concurrently or substantially concurrently with at least one of thermal annealing, gate dielectric formation, or threshold voltage adjustment associated with forming a NMOS transistor comprising a silicon nanowire channel.

According to an aspect of the instant disclosure, a semiconductor arrangement is provided. The semiconductor arrangement comprises a first nanowire transistor, such as a PMOS transistor. The first nanowire transistor comprises a first germanium nanowire channel formed between a first source region and a first drain region. The first nanowire transistor comprises a first gate structure formed around the first germanium nanowire channel. The semiconductor arrangement comprises a second nanowire transistor, such as an NMOS transistor. The second nanowire transistor comprises a first silicon nanowire channel formed between a second source region and a second drain region According to an aspect of the instant disclosure, a method for forming a semiconductor arrangement is provided. The method comprises forming a first silicon and silicon germanium stack over a substrate. The first silicon and silicon germanium stack comprises a first silicon layer and a first silicon germanium layer. A first source region is formed adjacent to a first side of the first silicon and silicon germanium stack. A first drain region is formed adjacent to a second side of the first silicon and silicon germanium stack. The first silicon and silicon germanium stack is oxidized to form a first germanium nanowire channel. The oxidizing comprises transforming the first silicon layer and silicon of the first silicon and germanium layer into a silicon oxide region. The first germanium nanowire channel is formed between the first source region and the first drain region. The silicon oxide region is removed. A first gate structure is formed around the first germanium nanowire channel to form a first nanowire transistor. A second nanowire transistor comprising a first silicon nanowire channel is formed within the semiconductor arrangement.

According to an aspect of the instant disclosure, a semiconductor arrangement is provided. The semiconductor arrangement comprises a PMOS nanowire transistor. The PMOS nanowire transistor comprises a first germanium nanowire channel formed between a first source region and a first drain region. The PMOS nanowire transistor comprises a first gate structure formed around the first germanium nanowire channel. The semiconductor arrangement comprises an NMOS nanowire transistor. The NMOS nanowire transistor comprises a first silicon nanowire channel formed between a second source region and a second drain region. The NMOS nanowire transistor comprises a second gate structure formed around the first silicon nanowire channel.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor arrangement, comprising:
    forming a first silicon and silicon germanium stack over a substrate, the first silicon and silicon germanium stack comprising a first silicon layer and a first silicon germanium layer;
    forming a first source region adjacent to a first side of the first silicon and silicon germanium stack;
    forming a first drain region adjacent to a second side of the first silicon and silicon germanium stack;
    oxidizing the first silicon and silicon germanium stack forming a first germanium nanowire channel, the oxidizing comprising transforming the first silicon layer and silicon of the first silicon germanium layer into a silicon oxide region, the first germanium nanowire channel formed between the first source region and the first drain region;
    removing the silicon oxide region;
    forming a first gate structure around the first germanium nanowire channel forming a first nanowire transistor; and
    forming a second nanowire transistor comprising a first silicon nanowire channel.

2. The method of claim 1, the forming the second nanowire transistor comprising:
    forming a second silicon and silicon germanium stack over the substrate, the second silicon and silicon germanium stack comprising a second silicon layer and a second silicon germanium layer;
    forming a second source region adjacent to a first side of the second silicon and silicon germanium stack;
    forming a second drain region adjacent to a second side of the second silicon and silicon germanium stack;
    removing the second silicon germanium layer from the second silicon and silicon germanium stack forming the first silicon nanowire channel, the first silicon nanowire channel formed between the second source region and the second drain region; and
    forming a second gate structure around the first silicon nanowire channel forming the second nanowire transistor.

3. The method of claim 1, comprising:
    forming a second germanium nanowire channel, within the first nanowire transistor, from the first silicon and silicon germanium stack.

4. The method of claim 2, comprising:
    forming a second silicon nanowire channel, within the second nanowire transistor, from the second silicon and silicon germanium stack.

5. The method of claim 1, comprising:
    forming the first nanowire transistor as a PMOS transistor and the second nanowire transistor as an NMOS transistor during a single fabrication process.

6. The method of claim 1, the oxidizing the first silicon and silicon germanium stack comprising:
    removing a sacrificial gate formed over the first silicon and silicon germanium stack exposing the first silicon and silicon germanium stack to oxygen.

7. The method of claim 1, comprising:
    forming an interfacial layer between the first germanium nanowire channel and the first gate structure.

8. The method of claim 1, comprising:
    forming a high k dielectric layer between the first germanium nanowire channel and the first gate structure.

9. The method of claim 2, the removing the second silicon germanium layer comprising at least one of:
    performing an oxidation technique exposing the second silicon layer to oxygen forming the first silicon nanowire channel; or
    performing a hydrogen annealing technique upon the second silicon layer forming the first silicon nanowire channel.

10. A method for forming a semiconductor arrangement, comprising:
    forming a first stack comprising a first layer having a first composition and a second layer having a second composition different than the first composition and a second stack comprising a third layer having the first composition and a fourth layer having the second composition;
    applying a first mask over the second stack;
    etching the first stack while the second stack is masked removing the first layer and forming a first nanowire channel;
    forming a first gate structure around the first nanowire channel;
    removing the first mask;
    applying a second mask over the first stack;
    etching the second stack while the first stack is masked removing the fourth layer and forming a second nanowire channel; and
    forming a second gate structure around the second nanowire channel.

11. The method of claim 10, the first layer and the third layer comprising silicon.

12. The method of claim 11, the second layer and the fourth layer comprising silicon germanium.

13. The method of claim 11, comprising, prior to the etching the first stack:
    applying oxygen to the first stack oxidizing the first stack.

14. The method of claim 10, comprising, prior to the forming the first gate structure:
    forming an interfacial layer around the first nanowire channel.

15. The method of claim 14, comprising, prior to the forming the first gate structure:
    forming a high k dielectric layer around the interfacial layer.

16. The method of 10, comprising, prior to the forming the second gate structure:
    applying oxygen to the second nanowire channel oxidizing the second nanowire channel.

17. The method of claim 16, comprising:
    annealing the second nanowire channel, after being oxidized, smoothing the second nanowire channel.

18. The method of claim 10, comprising, prior to the forming the second gate structure:
    forming an interfacial layer around the second nanowire channel.

19. A method for forming a semiconductor arrangement, comprising:
    forming a first stack comprising a first layer comprising silicon and a second layer comprising silicon germanium and a second stack comprising a third layer comprising silicon and a fourth layer comprising silicon germanium;
    applying a first mask over the second stack;
    applying oxygen to the first stack while the second stack is masked oxidizing the first stack;
    etching the first stack, after being oxidized and while the second stack is masked, removing the first layer, the second layer forming a first nanowire channel;
    forming a first gate structure around the first nanowire channel;
    removing the first mask;
    applying a second mask over the second stack;
    etching the second stack while the first stack is masked removing the fourth layer, the third layer forming a second nanowire channel; and
    forming a second gate structure around the second nanowire channel.

20. The method of claim 19, comprising:
    applying oxygen to the second nanowire channel while the second stack is masked oxidizing the second nanowire channel.

* * * * *